United States Patent [19]
Kelley et al.

[11] Patent Number: 5,587,662
[45] Date of Patent: Dec. 24, 1996

[54] METHOD AND APPARATUS FOR NONDISRUPTIVELY MEASURING LINE IMPEDANCE AT FREQUENCIES WHICH ARE RELATIVELY CLOSE TO THE LINE FREQUENCY

[75] Inventors: Arthur W. Kelley; Matthew B. Harris, both of Raleigh, N.C.

[73] Assignee: North Carolina State University, Raleigh, N.C.

[21] Appl. No.: 386,702

[22] Filed: Feb. 10, 1995

[51] Int. Cl.$^6$ ............................................. G01R 27/08
[52] U.S. Cl. ....................................... 324/713; 324/520
[58] Field of Search ................................ 324/715, 713, 324/110, 520, 521, 522, 525, 527; 364/483

[56] References Cited

U.S. PATENT DOCUMENTS

| | | | |
|---|---|---|---|
| 4,331,915 | 5/1982 | Fielden | 324/110 |
| 4,420,721 | 12/1983 | Dorey et al. | 324/110 |
| 4,689,570 | 8/1987 | Ohgaki et al. | 324/418 |
| 5,091,690 | 2/1992 | D'Antonio | 324/110 |

FOREIGN PATENT DOCUMENTS

0600726A2  6/1994  European Pat. Off. .

OTHER PUBLICATIONS

Girgis et al., "Frequency Domain Techniques for Modeling Distribution or Transmission Networks Using Capacitor Switching Induced Transients", IEEE Transactions on Power Delivery, vol. 4, No. 3, Jul. 1989, pp. 1882–1890.

Vines et al, "Impedance of the Residential Power–Distribution Circuit", IEEE Transactions on Electromagnetic Compatibility, vol. EMC–27, No. 1, Feb. 1985, pp. 6–12.

Banta et al, "Distribution System Impedance Measurement Technique", International Conference on Harmonics in Power Systems, Worcester Polytechnic Institute, Oct. 1984, pp. 220–224.

Vines, Thesis–"The Characterization of Residential Impedances and Noise Sources for Power Line Carrier Communications", Center for Communications and Signal Processing, North Carolina State University, Jun. 10, 1983.

Crevier et al., "Estimation of Higher Frequency Network Equivalent Impedances by Harmonic Analysis of Natural Waveforms", IEEE Transactions on Power Apparatus and Systems, vol. PAS–97, No. 2, Mar./Apr. 1978, pp. 424–431.

Kelley et al., "Instrumentation for Measurement of Line Impedance", Conference Proceedings of the 1994 Applied Power Electronics Conference (APEC'94) Orlando, Florida, Feb. 13–17, 1994, pp. 887–893.

(List continued on next page.)

*Primary Examiner*—Maura K. Regan
*Attorney, Agent, or Firm*—Bell, Seltzer, Park & Gibson

[57] ABSTRACT

Impedance of an energized electrical line which carries electrical current at a predetermined line frequency is nondisruptively measured at frequencies which are above and below the predetermined line frequency. A measurement current is generated at a measurement frequency between, for example, 10 Hz and 30 kHz for a 60 Hz line. The current generator is coupled to the energized electrical line by an isolating circuit which blocks only the predetermined line frequency and frequencies which differ from the predetermined line frequency by substantially less than the predetermined line frequency. For example, a notch filter may be used. A current sensor measures the line current in the energized line at the measurement frequency. A voltage sensor measures the line voltage in the energized electrical line at the measurement frequency. An analyzer determines impedance of the energized line at the measurement frequency. The measurement is repeated over a wide range of frequencies above and below the line frequency. Preferably, the current sensor and voltage sensor use the same current sensor to cancel errors. Improved nondisruptive line impedance measuring is thereby provided.

19 Claims, 6 Drawing Sheets

OTHER PUBLICATIONS

James L. Nance et al., *"Interactive Analysis and Design Program for Phase–Controlled Rectifiers Operating in the Closed–Loop Periodic–Steady–State and Transient Conditions"*, 1991 Applied Power Electronics Conference (APEC '91), Mar. 10–15, 1991, Dallas Texas, pp. 271–277.

Forti et al., *"Power–Line Impedance and the Orgin of the Low–Frequency Oscillatory Transients"*, IEEE Transactions on Electromagnetic Compatibility, vol. 32, May 1990, pp. 87–97.

METHOD AND APPARATUS FOR NONDISRUPTIVELY MEASURING LINE IMPEDANCE AT FREQUENCIES WHICH ARE RELATIVELY CLOSE TO THE LINE FREQUENCY

FIELD OF THE INVENTION

This invention relates to electrical measurement and testing methods and systems, and more particularly to a method and apparatus for measuring impedance of an energized electrical line which carries electrical current at a predetermined line frequency.

BACKGROUND OF THE INVENTION

Line impedance is an important measurement which is used for evaluating power quality and other purposes. Line impedance refers to the impedance of an electrical line which carries electrical current at a predetermined line frequency. It is important to know line impedance of a power line in order to determine the effect of a load on line voltage distortion. In particular, all nonlinear harmonic-producing loads draw a distorted line current that interacts with line impedance to produce line voltage distortion.

In view of the above, many line impedance measurement techniques have been developed. Unfortunately, each may suffer from a number of limitations. For example, in one technique, the assumed number of elements and topology for a lumped equivalent circuit of the line impedance is duplicated in a variable impedance. A bridge is created with the variable impedance tuned to balance the line impedance. See L. E. Banta et al., *"Distribution System Impedance Measurement Technique"*, Proceedings of the International Conference on Harmonics in Power Systems, Worcester Polytechnic Institute, October, 1984, pages 220–224. Another technique derives impedance by measuring the line voltage, magnitude and phase before and after applying a known load. See D. Crevier, *"Estimation of Higher Frequency Equivalent Impedances by Harmonic Analysis of Natural Waveforms"*, IEEE Transactions on Power Apparatus and Systems, Vol. PAS-97, No. 2, March/April 1978, pages 424–431.

In another technique, damped oscillatory voltage and current waveforms caused by transients such as capacitor switching, transformer inrush and/or line energization and deenergization are used to estimate line impedance. Spectral estimation may be used to estimate line impedance, as described in the publication by A. A. Girgis et al., *"Frequency Domain Techniques for Modeling Distribution or Transmission Networks Using Capacitor Switching Induced Transients"*, IEEE Transactions on Power Delivery, Vol. 4, No. 3, July 1989, pages 1882–1890. Alternatively, quadratic-impedance-model fitting may be used to estimate line impedance, as described in the publication by M. M. Forti et al., *"Power Line Impedance and the Origin of Low-Frequency Oscillatory Transients"*, IEEE Transactions on Electromagnetic Compatibility, Vol. 32, No. 2, May 1990, pages 87–97. Unfortunately, these transients may not sufficiently excite the line impedance at all frequencies.

In yet another technique, the measured response of an injected white noise signal has been used with spectral estimation to obtain a measure of line impedance magnitude without phase. See the above Banta et al. publication. Finally, injected sinusoidal currents have been used to measure line impedance in the 5–100 kHz range. See the publication by R. M. Vines, *"The Characterization of Residential Impedances and Noise Sources for Power Line Carrier Communications"*, Center for Communications and Signal Processing, North Carolina State University, Raleigh, N.C., Jun. 10, 1983. Unfortunately, the above techniques may be limited in accuracy and/or flexibility.

A technique for measuring impedance of a deenergized line in order to evaluate the condition of electrical insulation in a high voltage power system, is described in published European Patent Application No. 0 600 726 A2 to Allfather entitled *"Impedance Measuring"*. In this technique, a test voltage signal of frequency different from the line frequency by an increment significantly less than the line frequency is provided to the deenergized line in order to provide an impedance measurement signal representative of the impedance of the power system at the test frequency. Unfortunately, this technique is applicable to a deenergized line onto which a test voltage signal can be impressed.

SUMMARY OF THE INVENTION

The present invention is a method and apparatus for nondisruptively measuring impedance of an energized electrical line which carries electrical current at a predetermined line frequency, at frequencies which are relatively close to the predetermined line frequency and which are above and below the line frequency. An apparatus according to the present invention comprises means for generating a measurement current at a measurement frequency which is less than fifty times the predetermined line frequency. For example, frequencies between 10 Hz and 3 kHz may be generated for a 60 Hz line. Frequencies above 3 kHz may also be generated if desired.

Coupling means is provided for coupling the generating means to the energized electrical line. The coupling means includes isolating means for blocking only the predetermined line frequency and frequencies which differ from the predetermined line frequency by substantially less than the predetermined line frequency. The isolating means allows other frequencies to pass. For example, frequencies within ±10% of the line frequency are blocked, and all other frequencies are allowed to pass. The isolating means preferably comprises a notch filter which is tuned to the predetermined line frequency, and most preferably comprises a capacitor and an inductor connected in parallel.

An apparatus according to the present invention also includes current sensing means, which is electrically coupled to the energized line, for measuring the line current in the energized line at the measurement frequency. Voltage sensing means is also electrically coupled to the energized line, for measuring the line voltage in the energized electrical line at the measurement frequency. Analyzing means is responsive to the current sensing means and the voltage sensing means for determining impedance of the energized line from the sensed line current and the sensed line voltage.

In a preferred embodiment of the invention, the current sensing means comprises a first current sensor and the voltage sensing means comprises a resistor and a second current sensor which is the same as the first current sensor. The resistor and second current sensor are serially connected across the energized electrical line. By using the same current sensor in the voltage and current sensing means, gain errors, phase errors and other errors in the current sensors cancel to provide an accurate impedance measurement.

An apparatus according to the present invention preferably injects current into the energized line at a magnitude which is well below the magnitude of the current being carried by the line. Accordingly, the apparatus does not affect other electrical devices on the line. Moreover, impedance may be measured at frequencies which are relatively close to the line frequency, to thereby provide an accurate measurement of impedance at the frequencies of interest. Improved nondisruptive line impedance measuring is thereby provided.

In a method according to the present invention, a measurement current is injected into the energized electrical line at a measurement frequency which is less than fifty times the predetermined line frequency. A line current is measured in the energized electrical line at the measurement frequency and a line voltage is measured in the electrical line at the measurement frequency. The impedance of the energized electrical line is then determined from the line voltage and the line current. The measurement is repeated to obtain line impedance over the entire frequency range of interest. Frequencies above and below the predetermined line frequency are preferably used. Frequencies greater than fifty times the predetermined line frequency may also be used.

Preferably, the measurement current is injected into the energized electrical line while blocking the predetermined line frequency and frequencies which differ from the predetermined line frequency by substantially less than the predetermined line frequency (for example ±10%). Impedance is preferably determined by determining a magnitude and a phase angle of impedance of the energized line at the measurement frequency. Improved nondisruptive line impedance measurements are thereby provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
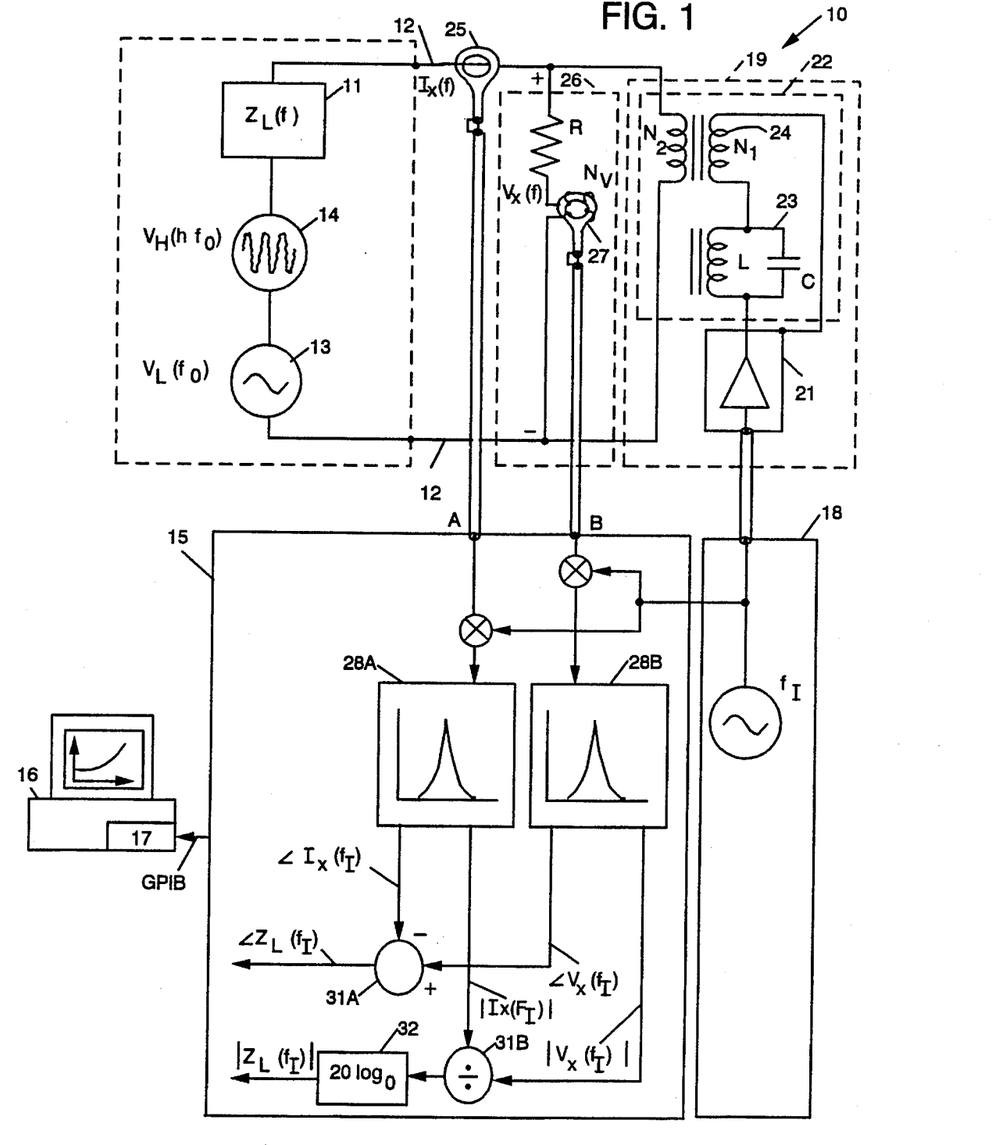
FIG. 1 schematically illustrates an apparatus according to the present invention.

Referring now to FIG. 1, an apparatus for nondisruptively measuring impedance of an energized electrical line according to the present invention will be described. As shown in FIG. 1, line impedance measuring apparatus 10 nondisruptively measures line impedance 11 of an energized electrical line 12 which carries electrical current at a predetermined line frequency $f_0$. The line 12 may be modelled by a series connection of a line impedance 11 and a line voltage fundamental 13. Nonlinear loads in the power system add line voltage harmonics 14 where h is the harmonic number. The apparatus 10 measures line impedance despite interference from the line voltage fundamental 13 and the line voltage harmonics 14. It will be understood that the apparatus 10 of FIG. 1 can be used to perform many impedance measurements. For example, although line-to-neutral measurements are described herein, it will be understood that line-to-ground, neutral-to-ground, and line-to-line impedance measurements may also be performed.

A multiple channel analyzer 15, such as a Hewlett Packard 8751 network analyzer, may be used to make the measurements under control of a computer 16, such as a Macintosh IIx computer, using a National Instruments (NI) NuBus (NB) General Purpose Interface Bus (GPIB) card 17 and the NI LabView Software System executing on computer 16, or other conventional analysis hardware and/or software. A graphical user interface may be used to enter measurement parameters and to display results.

Figure 2:
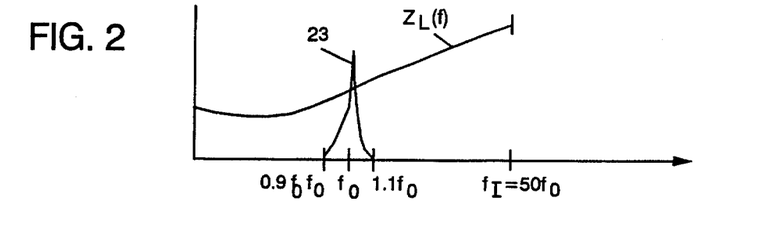
FIG. 2 graphically illustrates a line frequency measurement and operation of a notch filter according to the present invention.

As will be described in greater detail below, the analyzer 15 measures line impedance $Z_L(f)$ for discrete frequencies $f_I$ which are less than fifty times the predetermined line frequency. As shown in FIG. 2, for a line frequency $f_0$, measurements are taken up to $50f_0$. Thus, for a 60 Hz line, measurements from close to DC up to 3 kHz may be taken. It will be understood that the apparatus 10 may also be used at frequencies of more than fifty times the line frequency, for example up to 30 kHz or more. These higher frequencies are of much less interest in power quality measurements but are useful in electromagnetic interference (EMI) work.

In order to measure line impedance over a range of frequencies, the user may enter a minimum frequency, a maximum frequency, the number of points between the minimum and maximum frequencies, the number of measurements to average at each frequency, and the nominal value of the injection current. The time required to make a measurement depends on the parameters entered by the user, but is rarely longer than sixty seconds. Plots of line impedance magnitude $|Z_L(f_I)|$ and phase $<Z_L(f_I)$ are automatically displayed and saved as a plain text file for subsequent use and analysis by other software. Alternatively, without using computer 16, the network analyzer 15 can automatically measure line impedance as a function of frequency and save the result to a text file on a diskette, but the convenient graphical interface on the computer is lost.

Still referring to FIG. 1, line impedance measuring apparatus also includes a measurement current generator 18 which generates a sinusoidal signal of frequency $f_I$. Measurement current generator 18 may be implemented by a Hewlett Packard Model 3330B frequency synthesizer. However, preferably, as illustrated in FIG. 1, measurement current generator is part of Hewlett Packard 8751 analyzer 15.

The sinusoidal signal at $f_I$ is amplified and injected to the line 12 by coupling means 19. Coupling means 19 includes an amplifier 21, for example a Crown International Techron 7560 power amplifier. Coupling means 19 also includes isolating means 22 for blocking only the predetermined frequency and frequencies which are immediately adjacent thereto. In particular, frequencies which differ from the predetermined line frequency by substantially less than the predetermined line frequency, for example by one tenth the line frequency, are blocked. Thus, for a 60 Hz line frequency, frequencies of about ±6 Hz are blocked, while other frequencies are allowed to pass unblocked.

Isolating means 22 includes a notch filter 23 comprising a tuned circuit of parallel connected inductor L and capacitor C which are coupled to the line by an $N_1$-to-$N_2$ turn isolation transformer 24. Other notch filters may be used. The isolation transformer 24 may be formed of a National Magnetics CA-48, cut-C type, 12-mil silicon iron core, with windings $N_1 = N_2 = 390$ turns of #18 AWG bifilar wire. Inductor L may be a 45 mH inductor, using a National Magnetics CA-48 core, with winding of 334 turns of #14 AWG wire. Capacitor C may be a 158 µFAc oil filled capacitor.

The current injected at $f_I$ is approximately two orders of magnitude smaller than the rating of the line and therefore does not disrupt normal operation of other equipment on the line. The isolation transformer 24 provides DC isolation to allow line-to-line and other non-ground reference measurements. As $f_I$ increases, the relatively high leakage inductance of a typical isolation transformer presents a larger series impedance, making current injection more difficult. For minimum leakage inductance, the isolation transformer is wound bifilarly with N1=N2. The L-C filter 23 is tuned to 60 Hz to protect the power amplifier 21 from the large line-voltage fundamental appearing across the N1 turn winding of the isolation transformer. The high 60 Hz filter impedance also effectively prevents the amplifier from injecting current for $f_I$ near 60 Hz. For $f_I$ sufficiently removed from 60 Hz, the impedance of the L-C filter is low and only 5 to 10 volt-amperes (VA) are required for an accurate measurement.

The line current $I_X(f)$ and the line voltage $V_X(f)$ are composed of a line-frequency component at $f_0$, harmonic frequency components at $hf_0$, and an injection frequency component at $f_I$. Current and voltage sensors 25 and 26 respectively, measure $I_X(f)$ and $V_X(f)$, respectively. Both sensors provide the DC isolation required for non-ground-referenced measurements.

The current sensor 25 is preferably a commercially available wideband current transformer with internal burden. For example, a Pearson Electronics Model 411 constant 0.1 V per 1 A current transformer may be used. In the selection of a voltage sensor 26, voltage step-down (or potential) transformers were tested and found to have inadequate bandwidth. Accordingly, a non-inductive resistor R in series with an $N_V$-turn winding on a current transformer 27 is connected across $V_X(f)$ to provide voltage sensor 26. The resistor carries a current $V_X(f)/R$ that is small in comparison with $I_X(f)$, and the current transformer 27 measures $N_V V_X(f)/R$. Resistor R may be a 1400Ω, 25 W resistor such as a Caddock Electronics Model MP 820. Voltage sensor winding $N_V$ may be 100 turns of #28 AWG wire. Identical model current transformers are used in both the current and voltage sensors 25 and 26 to cancel any gain, phase or other errors inherent in the current transformer design.

The outputs of the current and voltage sensors 25 and 26 respectively, are supplied to channels A and B, respectively, of the network analyzer 15. It will also be understood that a general purpose digital signal processor may be used. Each channel uses a narrow-band filter 28A, 28B as part of a receiver tuned to frequency $f_I$. For maximum rejection of signals at $f_0$ and $hf_0$, the filter 3-dB bandwidth is set to its minimum value of 2 Hz for all measurements. Filter 28A extracts the magnitude $|I_X(f_I)|$ and phase $<\angle I_X(f_I)$ of $I_X(f_I)$, while rejecting "noise" signals at $f_0$ and $hf_0$, due to its narrow (2 Hz) bandwidth. Similarly, filter 28B extracts the magnitude $|V_X(f_I)|$ and phase $<V_X(f_I)$ of $V_X(f_I)$. Using this information, the network analyzer 18 further calculates the line impedance magnitude $$|Z_L(f_I)| = \frac{|V_X(f_I)|}{|I_X(f_I)|} \quad (1)$$

and the line impedance phase $$<Z_L(f_I)=<V_X(f_I)-<I_X(f_I) \quad (2)$$

using the summer 31A, divider 31B and scaler 32.

It will be understood that the transfer function from the frequency synthesizer 18 through the power amplifier 21, L-C filter 23, and isolation transformer 24 does not affect the measurement since $|Z_L(f_I)|$ and $<Z_L(f_I)$ depend on a ratio and difference, respectively. Finally, for each value of $f_I$, the value of $|I_X(f_I)|$ is also returned to the computer 16 over the GPIB and the computer adjusts the amplitude of the frequency synthesizer 18 to maintain the $|I_X(f_I)|$ near a nominal value $|I_{X, nom}(f_I)|$.

EXAMPLES

Demonstration measurements were performed on the electrical service available in Daniels Hall, North Carolina State University. The three-phase five-wire electrical service is 208-V line-to-line and 120-V line-to-neutral. The fourth floor of Daniels Hall is served by two 400-A panels located in Room 455. The #30 AWG conductors feeding the first panel are also routed through to the second panel located approximately one meter away. For line impedance measurements the two panels function as a single 800-A service, referred to herein as the 2×400-A panel.

Each of the three phases in the first panel feeds an equal number of single-phase 120-V lighting and receptacle circuits using #12 AWG conductors and protected by 20-A breakers. The second panel feeds a smaller number of 20-A circuits. In addition, the second panel feeds five three-phase five-wire receptacle circuits using #10 AWG conductors and protected by 30-A breakers. Line impedance measurements are presented for one 20-A circuit, one 30-A circuit, and the 2×400-A panel.

Figure 3A:
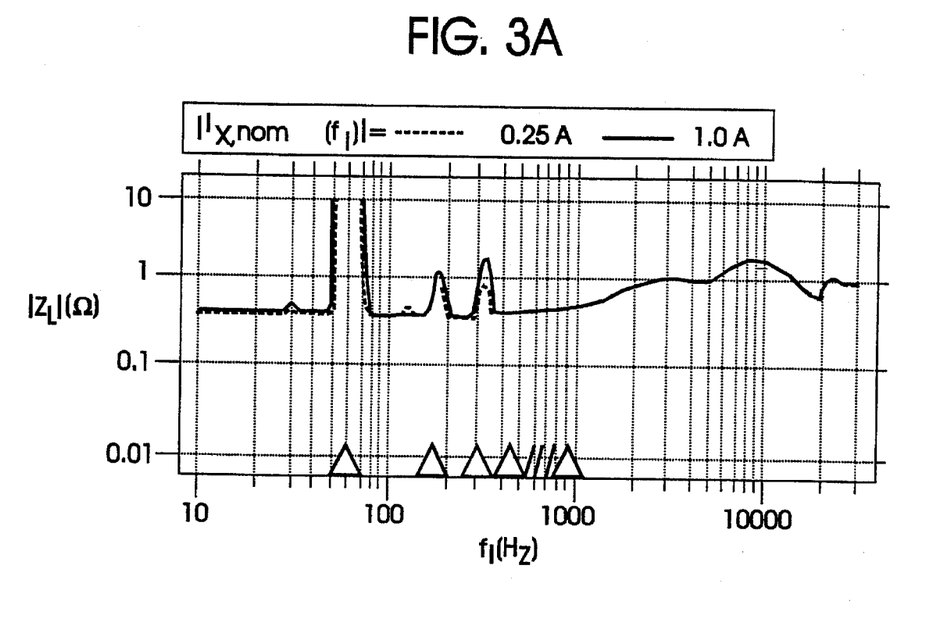
FIGS. 3A-3B, 4A-4B, 5A-5B, 6A-6B and 7A-7B graphically illustrate line impedance measurement values which were obtained with the apparatus of FIG. 1.
Figure 3B:
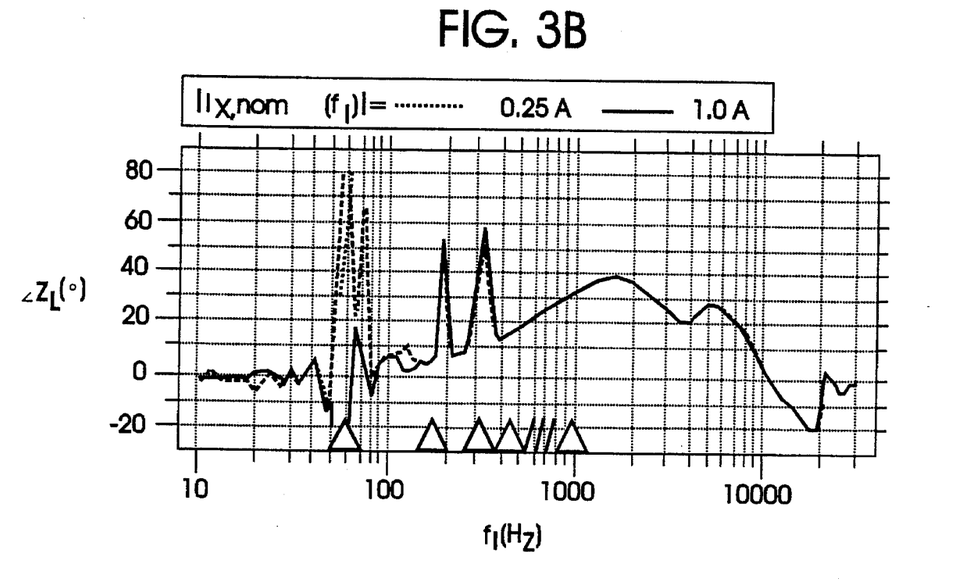

Using the line-to-neutral impedance of the 20-A circuit, this section describes the influence on line impedance measurement of the number of measurements M averaged per value of $f_I$, of the amplitude $|I_{X, nom}(f_I)|$ of the injection current, and of Gaussian smoothing of the impedance plots. FIGS. 3A and 3B show an example measurement of the line-to-neutral impedance of a 20-A circuit. The measurement was performed with $f_{I, min}$=10 HZ (the network analyzer's lower frequency limit), $f_{I,max}$=30 kHz (the power amplifier's upper frequency limit), P=201 points, M=1 measurement per point, and $|I_{x,nom}(f_I)|$=0.25 A.

Triangles on the frequency axis mark $f_0$=60 Hz and $hf_0$=180 Hz, 300 Hz, 420 Hz, 540 Hz, 660 Hz, 780 Hz, and 900 Hz. This apparatus does not accurately measure $Z_L(f)$ near $f_0$ and $hf_0$. For example, when $f_I$ is near $f_0$, the network analyzer cannot discriminate between the current and voltage at $f_I$ originating from the current generator 18 and the much larger current and voltage at $f_0$ originating from the power system. A similar measurement error occurs at the harmonic frequencies $hf_0$. The band of frequencies near $f_0$ and $hf_0$ over which $Z_L(f)$ cannot be measured depends both on the relative magnitudes of the voltage and current at $f_I$ and the voltage and current at $f_0$ or $hf_0$ and on the bandwidth of the network analyzer's filters. Despite the inability to measure $Z_L(f)$ near $f_0$ and $hf_0$, the values of $Z_L(f_0)$ and $Z_L(hf_0)$ can be interpolated from the two nearby valid measurement points on either side of $f_0$ and $hf_0$. Clearly offscale values for magnitude and phase at $f_0$ are not plotted. The band of frequencies over which $Z_L(f)$ is concealed depends on the magnitude of $I_X(f_I)$, the magnitude of $V_L(f_0)$ or $V_h(hf_0)$, and the bandwidth of the network analyzer's filters.

For magnitude in FIG. 3A for $f_I = f_0$, in contrast to Equation (1), the apparatus measures $$|Z_L(f_I = f_0)| = \frac{|V_L(f_0)|}{|I_X(f_I)|} \quad (3)$$

and similarly for $f_I = hf_0$ $$|Z_L(f_I = hf_0)| = \frac{|V_H(hf_0)|}{|I_X(f_I)|} \quad (4)$$

These errors appear in FIG. 3A as peaks in $|Z_L(f_I)|$ above the triangles marking the fundamental and harmonics. The height of the peaks decreases for the higher harmonic frequencies $hf_0$.

For phase in FIG. 3B for $f_I = f_0$, in contrast to Equation (2), the apparatus measures $$\angle Z_L(f_I = f_0) = \angle V_L(f_0) - \angle I_X(f_I) \quad (5)$$

and similarly for $f_I = hf_0$ $$\angle Z_L(f_I = hf_0) = \angle V_H(hf_0) - \angle I_X(f_I) \quad (6)$$

The phase errors shown in FIG. 3B are random since the frequency synthesizer is not synchronized with the line or its harmonics.

Figure 4A:
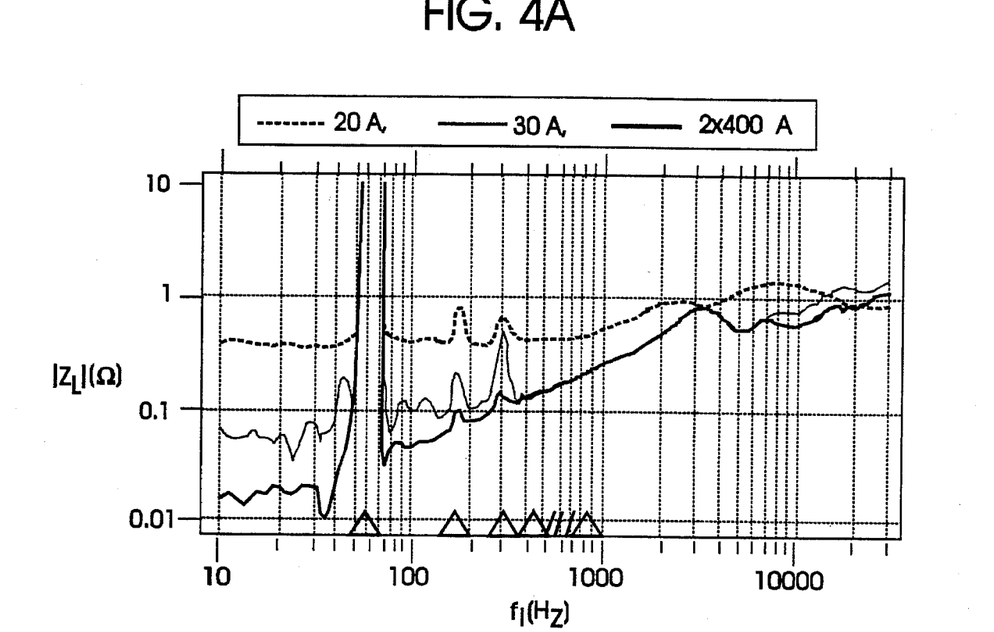
Figure 4B:
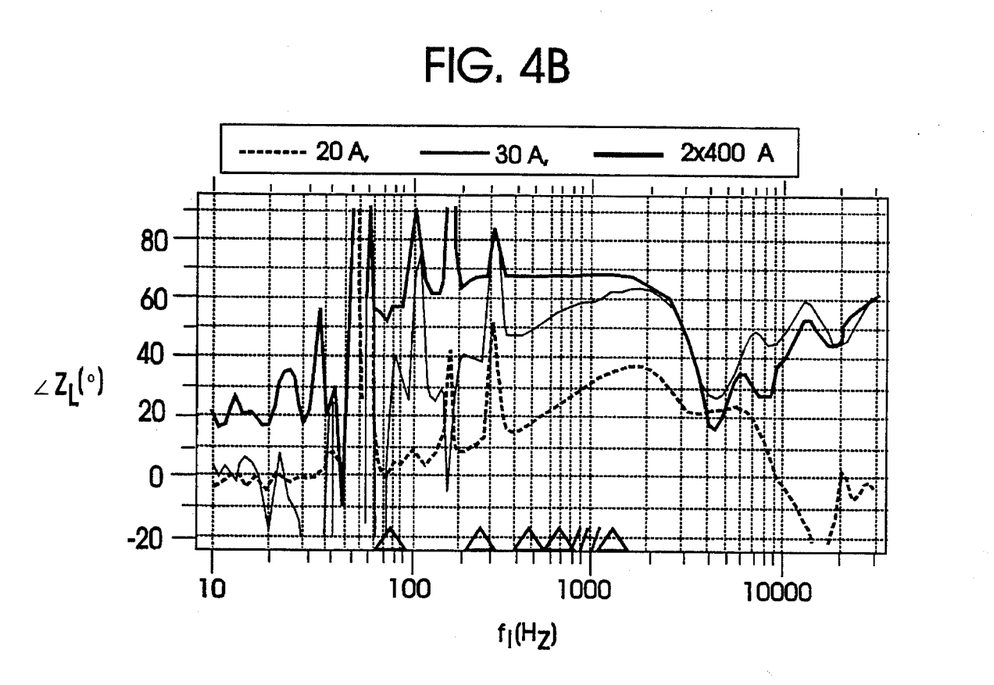

The impedance measurement is considerably improved if, for each $f_I$, M measurements are performed and averaged and the resulting plots smoothed with a Gaussian filter. FIGS. 4A and 4B show the line-to-neutral impedance of the 20-A circuit measured with M=50 and Gaussian smoothing. The phase measurement is particularly improved in comparison to FIGS. 3A and 3B.

Figure 5A:
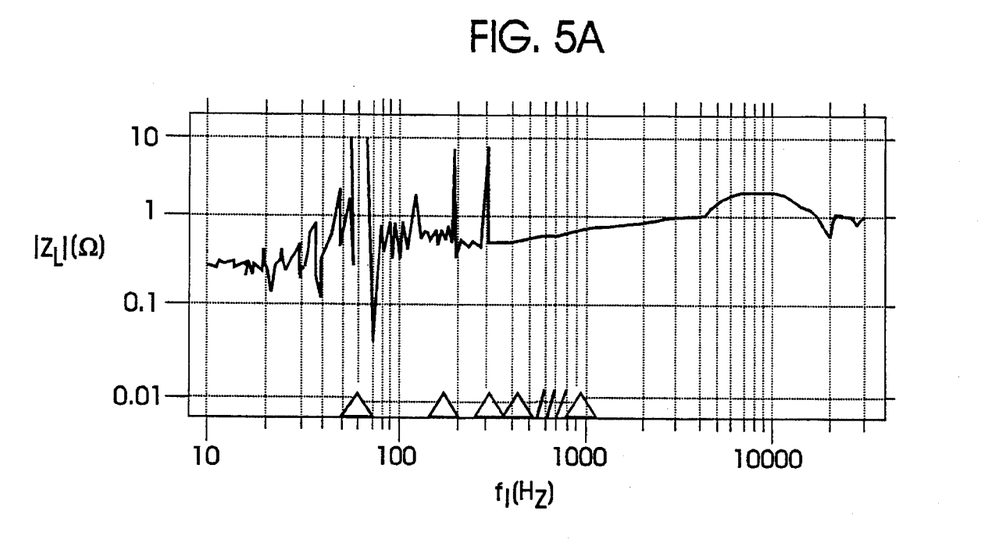
Figure 5B:
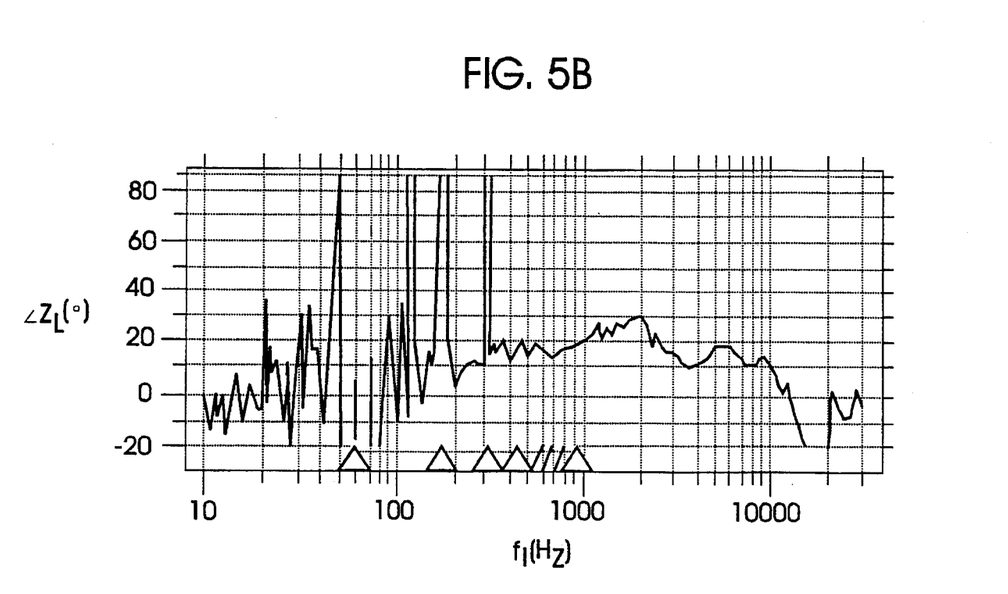

The measurement is also improved if $|I_{X,nom}(f_I)|$ is increased. FIGS. 5A and 5B show the line-to-neutral impedance of the 20-A circuit for $|I_{X,nom}(f_I)|=0.25$ A and 1.0 A. As $|I_{X,nom}(f_I)|$ is increased the band of frequencies over which $Z_L(f)$ is concealed near the fundamental and harmonics decreases. In accordance with Equation (4) the height of the peaks in $|Z_L(f_I)|$ for $F_I = hf_0$ decreases as $|I_{X,nom}(f_I)|$ is increased.

Figure 6A:
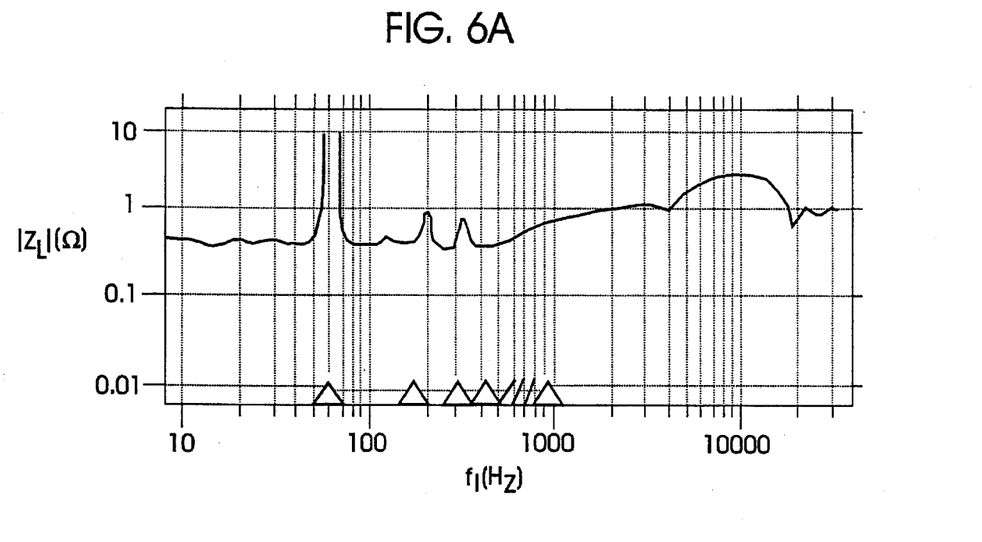
Figure 6B:
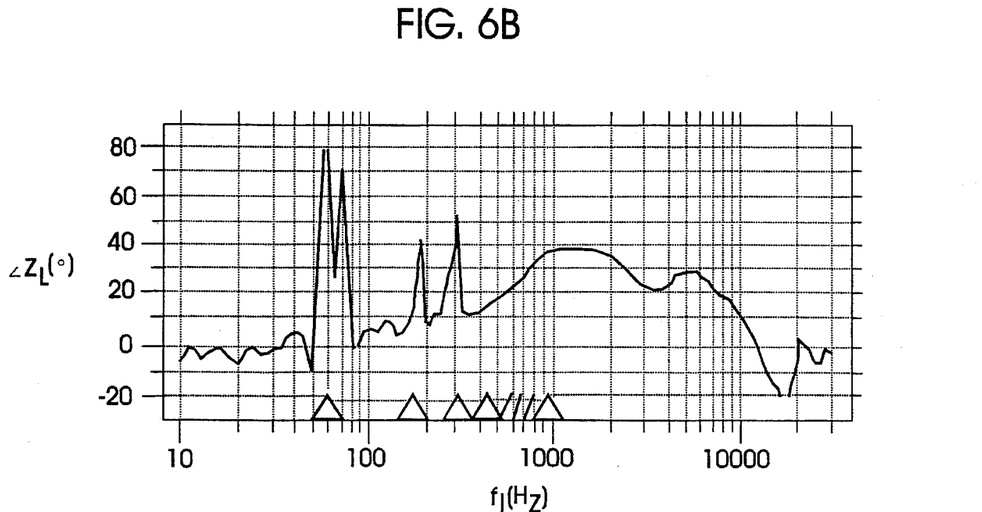

FIGS. 6A and 6B show the line-to-neutral impedance for the 20-A and 30-A circuits compared to the 2×400-A panel. The value of $|I_{X,nom}(f_I)|=0.25$ A for the 20-A circuit was increased to $|I_{X,nom}(f_I)|=0.5$ A for the 30-A circuit, and to $|I_{X,nom}(f_I)|=6$ A for the 2×400-A panel.

The 20-A and the 30-A circuits are fed from the 2×400-A panel. The line-to-neutral impedance measured for the 20-A and 30-A circuits includes the impedance of the 2×400-A panel. As expected, therefore, the line-to-neutral impedance measured to the 20-A and 30-A circuits is higher than the line-to-neutral impedance of the 2×400-A panel. Furthermore, the line-to-neutral impedance of the 20-A circuit using #12 AWG conductors is higher than the line-to-neutral impedance of the 30-A circuit using #10 AWG conductors. Finally, although not illustrated herein, the impedance of the portion of the 20-A and 30-A circuit from the 2×400-A panel to the outlets may be obtained by subtracting the 2×400-A impedance from the 20-A and 30-A impedances, respectively.

The impedance measured for the 2×400-A panel includes the impedance of the transformer from which it is fed (as do the subsequent 20-A and 30-A circuits). The two cannot be readily separated without access to the transformer secondary. However, if the impedance at the transformer secondary could be measured, the impedance of the transformer could be separated from the impedance of the conductors between the transformer and the 2×400-A panel.

Figure 7A:
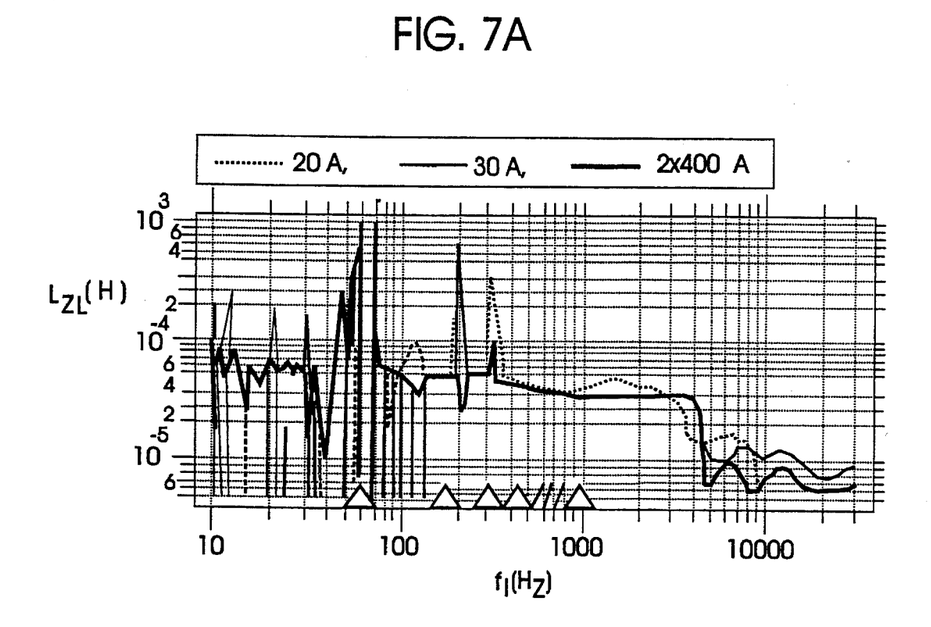
Figure 7B:
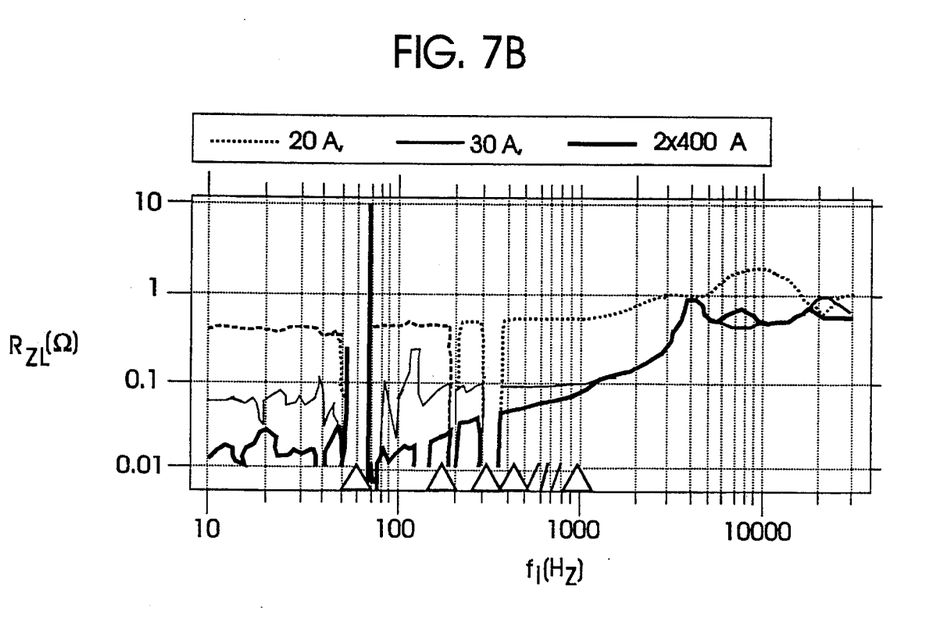

In FIGS. 6A–6B, the line impedance measurement is presented as a magnitude $|Z_L(f_I)|$ and a phase $\angle Z_L(f_I)$. The measurement is presented in FIGS. 7A and 7B as a resistive part $R_{ZL}(f_I)$ and inductive part $L_{ZL}(f_I)$ as found from $$R_{ZL}(f_I) = |Z_L(f_I)|\cos\angle Z_L(f_I) \quad (7)$$

$$L_{ZL}(f_I) = \frac{1}{2\pi f_I} |Z_L(f_I)|\sin\angle Z_L(f_I) \quad (8)$$

Alternatively, the resistive part is called the real part and the inductive part multiplied by radian frequency $2\pi f_I$ is called the imaginary part.

A conventional 60 Hz lumped line impedance model typically includes a constant-value resistor $r_s$ in series with a constant value inductor $L_s$. As shown in FIGS. 7A and 7B, as $f_I$ increases, $R_{ZL}(f_I)$ increases and $L_{ZL}(f_I)$ decreases. Therefore, the measurement shows that the resistive and inductive elements are frequency dependent.

Using the apparatus 10, other measurements not described herein may also be performed. For example, the line-to-neutral impedance is the series impedance of the line conductor, the transformer, and neutral conductor. Line-to-neutral, neutral-to-ground, and line-to-ground measurements have been combined to extract the impedance associated with the line conductor and transformer, the neutral conductor, and the ground conductor. This technique is useful for identifying bad wiring. The impedances of a three-phase system have been extracted by repeating the measurement of each phase. Finally, harmonic propagation measurements have been performed by injecting current $I_X(f_I)$ into the 30-A circuit and measuring voltage $V_X(f_I)$ at the 2×400-A panel.

The 120-V apparatus may be extended to a higher voltage level by a proportional increase in R for the voltage sensor 26 and $N_2$ for the isolation transformer 24. Extension to distribution voltages above 10 kV is conceptually possible, but may require careful attention to bandwidth and isolation for the transducers and isolation transformer.

Accordingly, a practical and nondisruptive method and apparatus for measuring line impedance as a function of frequency for an energized line in normal operation has been described. In contrast to previous instrumentation that passively acquires power system time waveforms, the apparatus 100 actively excites the power system to measure its impedance-versus-frequency characteristics. This measurement is a valuable tool in investigation the impact on power quality of existing and planned harmonic loads.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. Apparatus for nondisruptively measuring impedance of an energized electrical power line which carries electrical current at a predetermined line frequency, comprising:

means for generating a measurement current at a measurement frequency which is less than fifty times the predetermined line frequency;

means for coupling said generating means to the energized electrical power line, said coupling means including isolating means for only blocking the predetermined line frequency and frequencies which differ from the predetermined line frequency by substantially less than the predetermined line frequency;

current sensing means, electrically coupled to the energized electrical power line, for measuring a line current in said energized electrical power line at the measurement frequency;

voltage sensing means, electrically coupled to the energized electrical power line, for measuring a line voltage in the energized electrical power line at the measurement frequency; and analyzing means, responsive to said current sensing means and said voltage sensing means, for determining a magnitude and a phase angle of impedance of the energized electrical power line at the measurement frequency, from the line current and the line voltage.

2. Apparatus according to claim 1 wherein said current sensing means comprises a first current sensor and wherein said voltage sensing means comprises a resistor and a second current sensor which is same as said first current sensor, serially connected across said energized electrical power line, to thereby cancel errors in said first current sensor and in said second current sensor.

3. Apparatus according to claim 1 wherein said isolating means comprises a notch filter which is tuned to said predetermined line frequency, for only blocking the predetermined line frequency and frequencies which differ from the predetermined line frequency by substantially less than the predetermined line frequency.

4. Apparatus according to claim 3 wherein said notch filter comprises a capacitor and an inductor connected in parallel.

5. Apparatus according to claim 1 wherein said coupling means further comprises DC blocking means.

6. Apparatus according to claim 1 wherein said generating means generates a measurement current at measurement frequencies which are less than said predetermined line frequency, and at measurement frequencies which are greater than said predetermined line frequency.

7. Apparatus for nondisruptively measuring impedance of an energized electrical power line which carries electrical current at a predetermined line frequency, comprising:

a current generator which generates a measurement current;

a notch filter which couples said current generator to the energized electrical power line, and which only blocks the predetermined line frequency and frequencies which differ from the predetermined line frequency by substantially less than the predetermined line frequency;

a current sensor, electrically coupled to the energized electrical power line, which measures a line current in said energized electrical power line at the measurement frequency;

a voltage sensor, electrically coupled to the energized electrical power line, which measures a line voltage in the energized electrical power line at the measurement frequency; and an analyzer which is responsive to said current sensor and said voltage sensor, and which determines a magnitude and a phase angle of impedance of the energized electrical power line at the measurement frequency from the line current and the line voltage.

8. Apparatus according to claim 7 wherein said current sensor comprises a first current sensor and wherein said voltage sensor comprises a resistor and a second current sensor which is same as said first current sensor, serially connected across said energized electrical power line, to thereby cancel errors in said first current sensor and in said second current sensor.

9. Apparatus according to claim 7 wherein said notch filter is tuned to said predetermined line frequency.

10. Apparatus according to claim 9 wherein said notch filter comprises a capacitor and an inductor connected in parallel.

11. Apparatus according to claim 7 further comprising a DC isolation transformer which couples said notch filter to the energized electrical power line.

12. Apparatus according to claim 7 wherein said current generator generates a measurement current at frequencies which are greater than said predetermined line frequency and which are less than said predetermined line frequency.

13. Apparatus according to claim 7 wherein said analyzer is a narrow bandwidth analyzer which rejects signals at frequencies other than the frequency of the measurement current.

14. A method for nondisruptively measuring impedance of an energized electrical power line which carries electrical current at a predetermined line frequency, comprising the steps of:

injecting a measurement current into the energized electrical power line at a measurement frequency which is less than fifty times the predetermined line frequency;

measuring a line current in the energized electrical power line at the measurement frequency;

measuring a line voltage in the energized electrical power line at the measurement frequency; and determining a magnitude and a phase angle of impedance of the energized electrical power line at the measurement frequency, from the line voltage and the line current.

15. A method according to claim 14 wherein said injecting step comprises the step of injecting a measurement current into the energized electrical power line while only blocking the predetermined line frequency and frequencies which differ from the predetermined line frequency by substantially less than the predetermined line frequency.

16. A method according to claim 14 wherein said injecting step comprises the step of injecting a measurement current into the energized electrical power line while only blocking the predetermined line frequency and frequencies which differ from the predetermined line frequency by less than ten percent of the predetermined line frequency.

17. A method according to claim 15 wherein said step of measuring a line current comprises the step of measuring the line current using a first current sensor.

18. A method according to claim 17 wherein said step of measuring a line voltage comprises the step of measuring the line voltage using a resistor and a second current sensor which is same as the first current sensor, to thereby cancel errors in the first current sensor and in the second current sensor.

19. A method according to claim 14 wherein said injecting step is repeatedly performed at a plurality of measurement frequencies which are greater than and less than the predetermined line frequency.

* * * * *